(12) United States Patent
Allen et al.

(10) Patent No.: US 7,709,370 B2
(45) Date of Patent: May 4, 2010

(54) SPIN-ON ANTIREFLECTIVE COATING FOR INTEGRATION OF PATTERNABLE DIELECTRIC MATERIALS AND INTERCONNECT STRUCTURES

(75) Inventors: Robert D. Allen, San Jose, CA (US); Phillip J. Brock, Sunnyvale, CA (US); Blake W. Davis, Hollister, CA (US); Wu-Song S. Huang, Brewster, NY (US); Qinghuang Lin, Yorktown Heights, NY (US); Alshakim Nelson, Fremont, CA (US); Sampath Purushothaman, Yorktown Heights, NY (US); Ratnam Sooriyakumaran, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 333 days.

(21) Appl. No.: 11/858,615

(22) Filed: Sep. 20, 2007

(65) Prior Publication Data

US 2009/0081418 A1 Mar. 26, 2009

(51) Int. Cl.
*H01L 21/4763* (2006.01)
(52) U.S. Cl. .................. 438/622; 438/736; 438/740; 257/758; 257/E23.145; 257/E21.575
(58) Field of Classification Search ............... 438/622, 438/736, 740; 257/758, E23.145, E21.575
See application file for complete search history.

(56) References Cited

U.S. PATENT DOCUMENTS 4,371,605 A 2/1983 Renner
(Continued)

FOREIGN PATENT DOCUMENTS

CA 1204547 5/1986
(Continued)

OTHER PUBLICATIONS

European Patent Application Publication No. EP1077218 A2 dated Feb. 21, 2001, English-language abstract only.
(Continued)

*Primary Examiner*—Tu-Tu V Ho
(74) *Attorney, Agent, or Firm*—Scully, Scott, Murphy & Presser, P.C.; Daniel P. Morris, Esq.

(57) ABSTRACT

The present invention provides a method of fabricating an interconnect structure in which a patternable low-k material replaces the need for utilizing a separate photoresist and a dielectric material. Specifically, this invention relates to a simplified method of fabricating single-damascene and dual-damascene low-k interconnect structures with at least one patternable low-k dielectric and at least one inorganic antireflective coating. In general terms, a method is provided that includes providing at least one patternable low-k material on a surface of an inorganic antireflective coating that is located atop a substrate. The inorganic ARC is liquid deposited and comprises a polymer that has at least one monomer unit comprising the formula M-R$^1$ wherein M is at least one of Si, Ge, B, Sn, Fe, Ta, Ti, Ni, Hf and La and R$^1$ is a chromophore. At least one interconnect pattern is formed within the at least one patternable low-k material and thereafter the at least one patternable low-k material is cured. The inventive method can be used to form dual-damascene interconnect structures as well as single-damascene interconnect structures.

13 Claims, 2 Drawing Sheets

U.S. PATENT DOCUMENTS

| | | | |
|---|---|---|---|
| 4,956,313 A | 9/1990 | Cote et al. |
| 5,570,213 A | 10/1996 | Ruiz et al. |
| 5,886,102 A | 3/1999 | Sinta et al. |
| 5,939,236 A | 8/1999 | Pavelchek et al. |
| 6,087,064 A | 7/2000 | Lin et al. |
| 6,093,508 A | 7/2000 | Cote |
| 6,235,877 B1 | 5/2001 | Scolastico et al. |
| 6,274,292 B1 | 8/2001 | Holscher et al. |
| 6,323,123 B1 | 11/2001 | Liu et al. |
| 6,514,667 B2 | 2/2003 | Angelopoulos et al. |
| 6,518,668 B2 | 2/2003 | Cohen |
| 6,531,474 B1 | 3/2003 | Wannamaker et al. |
| 6,555,283 B1 | 4/2003 | Zhong et al. |
| 6,586,842 B1 | 7/2003 | You et al. |
| 6,610,151 B1 | 8/2003 | Cohen |
| 6,624,053 B2 | 9/2003 | Passemard |
| 6,628,358 B1 | 9/2003 | Colson |
| 6,649,531 B2 | 11/2003 | Cote et al. |
| 6,677,679 B1 | 1/2004 | You et al. |
| 6,713,234 B2 | 3/2004 | Sandhu et al. |
| 6,730,593 B2 | 5/2004 | Yau et al. |
| 6,737,345 B1 | 5/2004 | Lin et al. |
| 6,803,249 B2 | 10/2004 | Thomas et al. |
| 6,806,203 B2 | 10/2004 | Weidman et al. |
| 6,815,333 B2 | 11/2004 | Townsend, III et al. |
| 6,846,741 B2 | 1/2005 | Cooney, III et al. |
| 6,873,026 B1 | 3/2005 | Brunemeier et al. |
| 6,888,251 B2 | 5/2005 | Cooney, III et al. |
| 6,903,016 B2 | 6/2005 | Cohen |
| 6,916,696 B1 | 7/2005 | Buynoski |
| 6,924,226 B2 | 8/2005 | Cohen |
| 6,939,793 B1 | 9/2005 | You et al. |
| 6,939,796 B2 | 9/2005 | Lohokare et al. |
| 6,969,753 B2 | 11/2005 | Baldwin et al. |
| 7,001,847 B2 | 2/2006 | Watatani |
| 7,030,031 B2 | 4/2006 | Wille et al. |
| 7,041,748 B2 | 5/2006 | Lin et al. |
| 7,056,840 B2 | 6/2006 | Miller et al. |
| 7,067,894 B2 | 6/2006 | Sandhu et al. |
| 7,544,623 B2 * | 6/2009 | Chou et al. ................ 438/736 |
| 2001/0054766 A1 | 12/2001 | Dirahoui et al. |
| 2002/0173079 A1 | 11/2002 | Kaltalioglu |
| 2002/0177557 A1 | 11/2002 | Shi |
| 2003/0186494 A1 | 10/2003 | Rantala et al. |
| 2003/0219973 A1 | 11/2003 | Townsend, III et al. |
| 2004/0012089 A1 | 1/2004 | Rantala et al. |
| 2004/0072436 A1 | 4/2004 | RamachandraRao et al. |
| 2004/0077175 A1 | 4/2004 | Hsieh et al. |
| 2004/0137241 A1 | 7/2004 | Lin et al. |
| 2004/0185674 A1 | 9/2004 | M'Saad et al. |
| 2004/0192804 A1 | 9/2004 | Kura et al. |
| 2004/0222412 A1 | 11/2004 | Bai et al. |
| 2004/0266201 A1 | 12/2004 | Wille et al. |
| 2005/0017365 A1 | 1/2005 | RamachandraRao et al. |
| 2005/0040532 A1 | 2/2005 | Kumar et al. |
| 2005/0064726 A1 | 3/2005 | Reid et al. |
| 2005/0093158 A1 | 5/2005 | Liu et al. |
| 2005/0095839 A1 | 5/2005 | Chang et al. |
| 2005/0260845 A1 | 11/2005 | Ali |
| 2005/0272237 A1 | 12/2005 | Hautala et al. |
| 2006/0057801 A1 | 3/2006 | Rantala et al. |
| 2006/0105181 A1 | 5/2006 | Lin et al. |
| 2007/0085113 A1 | 4/2007 | Wu et al. |

FOREIGN PATENT DOCUMENTS

| | | |
|---|---|---|
| JP | 1293339 | 11/1989 |
| JP | 2004320037 | 11/2004 |
| WO | WO9810778 | 3/1998 |
| WO | WO0020440 | 4/2000 |
| WO | WO03065987 A2 | 8/2003 |
| WO | WO2004096838 A1 | 11/2004 |

OTHER PUBLICATIONS

Belvisi, L., et al., "Conformational Preferences of Peptides Containing Reverse-Turn Mimetic Bicyclic Lactams: Inverse γ-Turns versus Type-II' β-Turns—Insights into β-Hairpin Stability", European Journal of Medicinal Chemistry, Jan. 1, 1999, pp. 389-400, No. 2, Editions Scientifique Esevier, Paris, France.

Gennari, C., et al., "Solid-Phase Synthesis of Peptides Containing Reverse-Turn Mimetic Bicyclic Lactams", European Journal of Medicinal Chemistry, Jan. 1, 1999, pp. 379-388, No. 2, Editions Scientifique Esevier, Paris, France.

Obrecht, D., et al., "Novel Peptide Mimetic Building Blocks and Strategies for Efficient Lead Finding", Advances in Medicinal Chemistry, Apr. 1, 1999, pp. 1-68, Jai Press, U.S.

Hanssessian, S., et al., "Design and Synthesis of Conformationally Constrained Amino Acids as Versatile Scaffolds and Peptide Mimetics", Tetrahedron, Sep. 22, 1997, pp. 12789-12584, vol. 53, No. 38, Elsevier Science Publishers, Amsterdam, Netherlands.

* cited by examiner

SPIN-ON ANTIREFLECTIVE COATING FOR INTEGRATION OF PATTERNABLE DIELECTRIC MATERIALS AND INTERCONNECT STRUCTURES

FIELD OF THE INVENTION

The present invention relates to a patternable dielectric interconnect structure with improved lithography that is a part of integrated circuits and microelectronic devices. Specifically, the present invention relates to a single-damascene and dual-damascene interconnect structure that comprises a patternable low-k material and an antireflective coating that is deposited from the liquid phase. The present invention also relates to a method of fabricating such interconnect structures.

BACKGROUND OF THE INVENTION

It is widely known that the speed of propagation of interconnect signals is one of the most important factors controlling overall circuit speed as feature sizes are reduced and the number of devices per unit area as well as the number of interconnect levels are increased. Throughout the semiconductor industry, there has been a strong drive to increase the aspect ratio (i.e., height to width ratio) and to reduce the dielectric constant, k, of the interlayer dielectric (ILD) materials used to electrically insulate the metal conductive lines. As a result, interconnect signals travel faster through conductors due to a reduction in resistance-capacitance (RC) delays.

State-of-the-art semiconductor chips employ copper (Cu) as the electrical conductor and inorganic organosilicates as the low dielectric constant (low-k) dielectric, and have up to twelve levels of Cu/low-k interconnect layers. These Cu/low-k interconnect layers are fabricated with an iterative additive process, called dual-damascene, which includes several processing steps. For example, a typical dual-damascene process includes film deposition, patterning by lithography and reactive ion etching, liner deposition, Cu metal fill by electrochemical plating, and chemical-mechanical polishing of excessive Cu metal; these steps are described in greater detail in the following paragraphs.

When fabricating integrated circuit wiring within a multi-layered scheme, an insulating or dielectric material, e.g., silicon oxide or a low-k insulator will normally be patterned with several thousand openings to create conductive line openings and/or via openings using photo patterning and plasma etching techniques, e.g., photolithography with subsequent etching by plasma processes. The via openings are typically filled with a conductive metallic material, e.g., aluminum, copper, etc., to interconnect the active and/or passive elements of the integrated circuits. The semiconductor device is then polished to level its surface.

A continuous cap layer is then normally deposited over the planarized surface featuring the dielectric material and conductive metallic material. Next, a dielectric material is deposited over the continuous cap layer, via and line openings are created within the dielectric layer as before, another conductive metallic material is deposited within the openings and another continuous cap layer is deposited thereon. The process is repeated to fabricate a multi-layer interconnect wiring system. The multi-layer interconnect system built thereby is referred to in the art as a dual-damascene integration scheme.

Unfortunately, the strategy to introduce low-k materials (typically dielectrics whose dielectric constant is below that of silicon oxide) into advanced interconnects is difficult to implement due to the new materials chemistry of the low-k materials that are being introduced. Moreover, low-k dielectrics exhibit fundamentally weaker electrical and mechanical properties as compared to silicon oxide. Moreover, the low-k dielectric alternatives are typically susceptible to damage during the various interconnect processing steps. The damage observed in the low-k dielectric materials is manifested by an increase in the dielectric constant and an increased moisture uptake, which may result in reduced performance and device reliability.

One way to overcome the integration challenges of low-k materials is to protect these low-k dielectric materials by adding at least one sacrificial hardmask layer onto a surface of the low-k dielectric material. While the hardmask layer serves to protect the low-k material, the presence of the sacrificial hardmask layer adds enormous process complexity as more film deposition, pattern transfer etch, and removal of hardmask layers are needed.

A state-of-the-art back-end-of-the-line (BEOL) integration process, called a low temperature oxide (LTO) process, employs up to eight layers of sacrificial hardmask materials to fabricate a two-layer dual-damascene interconnect structure.

For example, a via-first LTO integration for forming a dual-damascene interconnect includes the steps of: depositing a dielectric material on a substrate including a patterned conductor; forming at least one via in said dielectric material, such that at least one of the vias is positioned over the patterned conductor; depositing a layer of planarizing material on the dielectric material and in the via; depositing a layer of barrier material on the layer of planarizing material; depositing at least one layer of imaging material on the layer of barrier material; forming at least one trench in the imaging material, barrier material and planarizing material, such that the at least one trench is positioned over the via; removing the imaging material, either after or concurrently with forming the trench in the planarizing material; transferring the at least one trench to the dielectric material, such that at least one of the trenches is positioned over the via; removing the barrier material, either after or concurrently with transferring the at least one trench to the dielectric material; and removing the planarizing material.

A line-first LTO integration for forming a dual-damascene interconnect structure includes the steps of: depositing a dielectric material on a substrate including a patterned conductor; forming at least one trench in the dielectric material, such that the at least one trench is positioned over the patterned conductor; depositing a layer of planarizing material on the dielectric material and in the trench; depositing a layer of barrier material on the layer of planarizing material; depositing at least one layer of imaging material on the layer of barrier material; forming at least one via in the imaging material, barrier material and planarizing material, such that at least one of the vias is positioned over the trench and the patterned conductor; removing the imaging material, either after or concurrently with forming the via in the planarizing material; transferring the at least one via to the dielectric material, such that at least one of the vias is positioned over the trench and the patterned conductor; removing the barrier material, either after or concurrently with transferring the at least one via to the dielectric material; and removing the planarizing material.

The integration schemes, such as the LTO one mentioned above, are very complex, inefficient, and costly. For example, the via-first LTO integration scheme requires ten layers of films and twenty-one process steps to form a two-layer dual-damascene dielectric structure. In other words, 80% of films are not needed in the final interconnect structure.

Although immensely popular in semiconductor manufacturing, the prior art dual-damascene integration scheme described above suffers from several drawbacks including:

(I) First, it constitutes a significant portion of manufacturing cost of advanced semiconductor chips as many layers, up to twelve layers for the state-of-the-art chips, are required to connect the minuscule transistors within a chip and to the printed circuit board.

(II) Second, it is a yield detractor as the many layers of films required to form the interconnects generate chances for defect introduction and, thus, degrade manufacturing yields.

(III) Third, it is very inefficient and embodies enormous complexity. The current dual-damascene integration scheme requires many sacrificial films (80% of the film stack) to pattern and protect the fragile interlayer dielectric films from damage during processing. These sacrificial patterning and protective films have to be removed after patterning and copper plating.

(IV) Fourth, the performance gain by introduction of new lower-k materials is often offset by the needs for higher-k non-sacrificial materials, such as a cap layer, a hardmask layer, or a thicker copper barrier layer.

(V) Fifth, the prior art complex dual-damascene process lengthens manufacturing turn-around time and R&D development cycle.

(VI) Sixth, the plasma etching process is an expensive and often unreliable process and requires significant up-front capital investment.

In view of the above, there is a need to simplify the formation of interconnects (single-damascene and dual-damascene) including low-k dielectrics for cost-saving and manufacturing efficiency.

SUMMARY OF THE INVENTION

The problems described above in prior art processes of fabricating interconnect (single-damascene and dual-damascene) structures are solved by using a dramatically simplified integration method of this invention. The present invention thus relates to a method of forming interconnect structures that are part of integrated circuits and microelectronic devices with patternable dielectrics combined with an antireflective coating that is formed from a liquid phase.

This invention circumvents the prior art drawbacks of current integration by combining the functions of a photoresist and a dielectric material into one material. This one material, called a photo-patternable low-k dielectric (or patternable low-k material for short), acts as a photoresist during the lithographic patterning process, and as such, no separate photoresist is required. After lithographic patterning, the patternable low-k dielectric is subsequently converted into a low-k material during a post patterning cure. In this way, the inventive method avoids plasma etching and the complex sacrificial film stack and processes required for patterning.

In the inventive method, an antireflective coating layer is required for patterning of a patternable low-k material via lithography. Unfortunately, conventional organic antireflective coatings are generally not suitable for the lithography of a patternable low-k material as the antireflective coating layer is a permanent part of the interconnect structure. These organic antireflective coatings typically cannot withstand high temperature processes such as, for example, during either the curing of the patternable low-k dielectric or annealing of the interconnect metal.

Thus, the present invention provides an antireflective coating (ARC) for lithography and interconnect integration of patternable low-k materials. The antireflective coating that is employed in the present invention is a permanent part of the interconnect structure and is formed by liquid deposition including, for example, spin-on, spray coating, evaporation, chemical solution deposition, dip coating or brush coating.

In particular, the inventive ARC is formed by liquid phase deposition of a liquid composition that includes an inorganic precursor that has atoms of M, C and H, wherein M is at least one of Si, Ge, B, Sn, Fe, Ta, Ti, Ni, Hf and La. The inorganic precursor used in forming the ARC may optionally include atoms of O, N, S, F or mixtures thereof. In some embodiments, M is preferably Si. The liquid composition also includes, in addition to the inorganic precursor, a chromophore, a cross-linking component, an acid generator and a solvent.

Once the liquid composition is deposited and subsequently cured, an ARC is formed including at least one monomer unit in which the M of the inorganic precursor is bonded to the chromophore; hereinafter this monomer unit is written as M-$R^1$ wherein M is defined above and $R^1$ is the chromophore. In this formula, M within the monomer unit may also be bonded to organic ligands including atoms of C and H, a cross-linking component, another chromophore or mixtures thereof. The organic ligands may further include one of O, N, S and F. When the organic ligand is bonded to M, it is bonded to M through C, O, N, S, or F.

In some embodiments of the present invention, the liquid composition includes at least one first monomer unit in which the M of the inorganic precursor is bonded to the chromophore (M-$R^1$) and at least one second monomer unit in which another M of the inorganic precursor is bonded to a cross-linking component (i.e., M'-$R^2$), wherein M or M' each is at least one of Si, Ge, B, Sn, Fe, Ta, Ti, Ni, Hf and La. M and M' may be the same or different elements. In these two formulae, M and M' within the monomer unit may be also be bonded to organic ligands including atoms of C and H, a cross-linking component, a chromophore or mixtures thereof. The organic ligands may further include one of O, N, S and F. When the organic ligand is bonded to M and M', it is bonded to M or M' through C, O, N, S, or F.

The liquid ARC composition comprising M-R' or M-$R^1$ and M'-$R^2$ may further comprise at least one additional component, including a separate crosslinker, an acid generator or a solvent.

Specifically, this invention relates to a simplified method of fabricating single-damascene and dual-damascene low-k interconnect structures with at least one patternable dielectric. In general terms and in one aspect of the present invention, a method is provided that comprises:

providing at least one patternable low-k material on a surface of an inorganic antireflective coating (ARC) that is located atop a substrate, said inorganic ARC is liquid deposited and comprises a polymer that has at least one monomer unit comprising the formula M-$R^1$ wherein M is at least one of Si, Ge, B, Sn, Fe, Ta, Ti, Ni, Hf and La and $R^1$ is a chromophore;

forming at least one interconnect pattern within said at least one patternable low-k material, said at least one interconnect pattern is formed without utilizing a separate photoresist material; and curing said at least one patternable low-k material and the inorganic ARC into materials having a dielectric constant of not more than 4.3 and 7.0, respectively.

In some embodiments of this method of the present invention, M within the monomer unit may also be bonded to organic ligands including atoms of C and H, a cross-linking component, another chromophore or mixtures thereof. The organic ligands may further include one of O, N, S and F. When the organic ligand is bonded to M, it is bonded to M through C, O, N, S, or F.

In other embodiments of the present invention, the ARC may also include at least one second monomer unit, in addition to the at least one monomer unit represented by the formula M-$R^1$. When present, the at least one second monomer unit has the formula M'-$R^2$, wherein $R^2$ is a cross-linking agent and M' is at least one of Si, Ge, B, Sn, Fe, Ta, Ti, Ni, Hf and La. M and M' may be the same or different elements. In these two formulae, M and M' within the monomer unit may be also be bonded to organic ligands including atoms of C and H, a cross-linking component, a chromophore or mixtures thereof. The organic ligands may further include one of O, N, S and F. When the organic ligand is bonded to M and M', it is bonded to M or M' through C, O, N, S, or F.

The liquid ARC composition comprising M-$R^1$ or M-$R^1$ and M'-$R^2$ may also comprise at least one additional component, including a separate crosslinker, an acid generator or a solvent.

In some embodiments of the present invention, a dielectric cap is formed on the substrate prior to forming the inorganic ARC by liquid deposition.

The present invention also contemplates a step of forming contact holes through the antireflective coating or material stack including the antireflective coating and the dielectric cap after forming the interconnect patterns.

In yet a further embodiment of the present invention, a conductive material such as Al, Cu, or a Cu alloy is formed into the interconnect patterns. A planarization process such as chemical mechanical polishing may follow the step of filling the interconnect patterns.

In an even further embodiment of the present invention, a dielectric cap is formed atop the cured low-k material after filling the interconnect patterns with a conductive material and removing any excessive conductive material.

In any of the embodiments mentioned above, the interconnect patterns may comprise via openings, line openings, a combination of via openings located beneath line openings or a combination of line openings located beneath via openings. In one embodiment, it is preferred to have via openings located beneath line openings. It is noted that in the present invention each individual pair of line/via openings or via/line openings is interconnected.

The present invention contemplates the use of positive-tone patternable low-k materials, negative-tone patternable low-k materials or any combination thereof.

In another aspect of the present invention, the present invention provides a simplified method of fabricating dual-damascene low-k interconnect structures with at least one negative-tone patternable low-k dielectric and/or at least one positive-tone patternable low-k dielectric. This aspect of the present invention includes the steps of:

providing a first patternable low-k material on a surface of an inorganic antireflective coating (ARC) that is located atop a substrate, said inorganic ARC is liquid deposited and comprises a polymer that has at least one monomer unit comprising the formula M-$R^1$ wherein M is at least one of Si, Ge, B, Sn, Fe, Ta, Ti, Ni, Hf and La and $R^1$ is a chromophore;

forming first interconnect patterns within the patternable low-k material without a separate photoresist material;

providing a second patternable low-k material on top of the first patternable low-k material including said first interconnect patterns;

forming second interconnect patterns within said second patternable low-k material without a separate photoresist material; and curing said at least one patternable low-k material and the inorganic ARC into materials having a dielectric constant of not more than 4.3 and 7.0, respectively.

In some embodiments of this method of the present invention, M within the monomer unit may also be bonded to organic ligands including atoms of C and H, a cross-linking component, another chromophore or mixtures thereof. The organic ligands may further include one of O, N, S and F. When the organic ligand is bonded to M, it is bonded to M through C, O, N, S, or F.

In other embodiments of the present invention, the ARC may also include at least one second monomer unit, in addition to the at least one monomer unit represented by the formula M-$R^1$. When present, the at least one second monomer unit has the formula M'-$R^2$, wherein M' is at least one of Si, Ge, B, Sn, Fe, Ta, Ti, Ni, Hf and La, and $R^2$ is a cross-linking agent. M and M' may be the same or different elements. In these two formulae, M and M' within the monomer unit may be also be bonded to organic ligands including atoms of C and H, a cross-linking component, a chromophore or mixtures thereof. The organic ligands may further include one of O, N, S and F. When the organic ligand is bonded to M and M', it is bonded to M or M' through C, O, N, S, or F.

The liquid ARC composition comprising M-$R^1$ or M-$R^1$ and M'-$R^2$ may also comprise at least one additional component, including a separate crosslinker, an acid generator or a solvent.

In another embodiment of the present invention, a dielectric cap is formed on top of the substrate prior to forming the ARC.

The present invention also contemplates a step of forming contact holes through the antireflective coating or material stack including the antireflective coating and the dielectric cap after forming the first and second interconnect patterns.

In yet other embodiments of the present invention, a curing step is performed after providing the first interconnect patterns to the first patternable low-k material.

In yet a further embodiment of the present invention, a conductive material such as Al, Cu, or a Cu alloy is formed into the first and second interconnect patterns. A planarization process such as chemical mechanical polishing may follow the step of filling the first and second interconnect patterns.

In an even further embodiment of the present invention, a dielectric cap is formed atop the cured second patternable low-k material after filling the first and second interconnect patterns with a conductive material.

In any of the embodiments mentioned above, the first interconnect patterns may comprise via openings, while the second interconnect patterns may comprise line openings. This embodiment is preferred over an embodiment in which the first interconnect patterns comprise line openings and the second interconnect patterns comprise via openings.

This invention also relates to a simplified method of fabricating single-damascene low-k interconnect structures with negative-tone or positive-tone patternable low-k dielectrics. This aspect of the present invention comprises the steps of:

providing a patternable low-k material on a surface of an inorganic antireflective coating (ARC) that is located atop a substrate, said inorganic ARC is liquid deposited and comprises a polymer that has at least one monomer unit comprising the formula M-$R^1$ wherein M is at least one of Si, Ge, B, Sn, Fe, Ta, Ti, Ni, Hf and La and $R^1$ is a chromophore;

forming interconnect patterns within the patternable low-k material without a separate photoresist material; and curing said patternable low-k material and the inorganic ARC into materials having a dielectric constant of not more than 4.3 and 7.0, respectively.

In some embodiments of this method of the present invention, M within the monomer unit may also be bonded to organic ligands including atoms of C and H, a cross-linking component, another chromophore or mixtures thereof. The organic ligands may further include one of O, N, S and F. When the organic ligand is bonded to M, it is bonded to M through C, O, N, S, or F.

In other embodiments of the present invention, the ARC may also include at least one second monomer unit, in addition to the at least one monomer unit represented by the formula M-R$^1$. When present, the at least one second monomer unit has the formula M'-R$^2$, wherein M' is at least one of Si, Ge, B, Sn, Fe, Ta, Ti, Ni, Hf and La, and R$^2$ is a cross-linking agent. M and M' may be the same or different elements. In these two formulae M and M' within the monomer unit may be also be bonded to organic ligands including atoms of C and H, a cross-linking component, chromophore or mixtures thereof. The organic ligands may further include one of O, N, S and F. When the organic ligand is bonded to M and M', it is bonded to M or M' through C, O, N, S, or F.

The liquid ARC composition comprising M-R$^1$ or M-R$^1$ and M'-R$^2$ may also comprise at least one additional component, including a separate crosslinker, an acid generator or a solvent.

In another embodiment of the present invention, a dielectric cap is formed on top of the substrate prior to forming the ARC.

The present invention also contemplates a step of forming contact holes through the antireflective coating or material stack including the antireflective coating and the dielectric cap after forming the interconnect patterns.

In yet a further embodiment of the present invention, a conductive material such as Al, Cu, or a Cu alloy is formed into the interconnect patterns. A planarization process such as chemical mechanical polishing may follow the step of filling the interconnect patterns.

In an even further embodiment of the present invention, a dielectric cap is formed atop the cured patternable low-k material after filling the interconnect patterns with a conductive material.

In any of the embodiments mentioned above, the interconnect patterns may comprise via openings or line openings.

This patternable low-k/inorganic ARC method of present invention dramatically reduces the complexity in the fabrication of current interconnect structures. The photoresist used in the prior art integration is no longer needed. In addition to not requiring a separate photoresist, the present invention also does not utilize a plasma etching step for patterning as also required in the prior art interconnect processing schemes. It is further noted that the inventive method reduces the number of layers required to fabricate the interconnect structure and, as such, the present invention reduces the time and cost of fabricating interconnect structures as compared to prior art processes.

In addition to the methods described above, the present invention also relates to interconnect structures which include the patternable low-k dielectric material in a cured state; in the cured state the patternable low-k material serves as the interconnect dielectric. In general terms, the present invention provides an interconnect structure comprising at least one patterned and cured low-k dielectric material located on a surface of a patterned and cured inorganic antireflective coating (ARC) that is located atop a substrate, said inorganic ARC comprises a cured polymer that has at least one monomer unit comprising the formula M-R$^1$ wherein M is at least one of Si, Ge, B, Sn, Fe, Ta, Ti, Ni, Hf and La and R$^1$ is a chromophore, and said at least one cured and patterned low-k material and said patterned and cured inorganic antireflective coating (ARC) having conductively filled regions embedded therein.

In some embodiments of this method of the present invention, M within the monomer unit may also be bonded to organic ligands including atoms of C and H, a cross-linking component, another chromophore or mixtures thereof. The organic ligands may further include one of O, N, S and F. When the organic ligand is bonded to M, it is bonded to M through C, O, N, S, or F.

In other embodiments of the present invention, the ARC may also include at least one second monomer unit, in addition to the at least one monomer unit represented by the formula M-R$^1$. When present, the at least one second monomer unit has the formula M'-R$^2$, wherein M' is at least one of Si, Ge, B, Sn, Fe, Ta, Ti, Ni, Hf and La, and R$^2$ is a cross-linking agent. M and M' may be the same or different elements. In these two formulae, M and M' within the monomer unit may be also be bonded to organic ligands including atoms of C and H, a cross-linking component, a chromophore or mixtures thereof. The organic ligands may further include one of O, N, S and F. When the organic ligand is bonded to M and M', it is bonded to M or M' through C, O, N, S, or F.

The liquid ARC composition comprising M-R$^1$ or M-R$^1$ and M'-R$^2$ may also comprise at least one additional component, including a separate crosslinker, an acid generator or a solvent.

In some further embodiments of the present invention, a dual-damascene interconnect structure including first and second cured and patterned low-k materials is provided. In yet another embodiment of the present invention, a single-damascene interconnect structure is provided.

In a further embodiment of the present invention a patterned dielectric cap layer is located beneath the inorganic antireflective coating. In still another embodiment of the present invention, another dielectric cap can be present atop the patterned low-k film.

In yet another embodiment of the present invention, the conductively filled regions comprise Al, Cu or a Cu alloy. In an even further embodiment of the present invention, the conductively filled regions comprise a single via, a single line, a combined via/line or a combined line/via.

DETAILED DESCRIPTION OF THE INVENTION

Figure 1A:
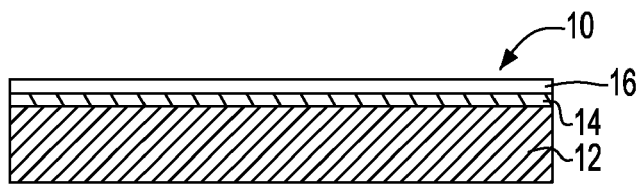
FIGS. 1A-1F are pictorial representations (through cross sectional views) depicting the basic processing steps employed for fabricating a dual-damascene interconnect structure using patternable dielectrics as on-chip electrical insulators on a semiconductor chip.

The present invention, which provides single-damascene or dual-damascene low-k interconnect structures with a combined inorganic antireflective coating (ARC) and patternable low-k dielectric and methods of fabricating such interconnect structures, will now be described in greater detail by referring to the following discussion and drawings that accompany the present application. It is noted that the drawings that accompany the present application are provided for illustrative purposes only, and, as such, these drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. When the word "conductive" or "conducting" is used, it is used to mean electrically conductive or electrically conducting.

As stated above, this invention circumvents the prior art drawbacks of current integration by combining the functions of a photoresist and a dielectric material into one material. This one material, called a patternable low-k dielectric herein, acts as a photoresist during the lithographic patterning process and, as such a separate photoresist is not required or used in the present invention. After lithographic patterning, the patternable low-k dielectric is subsequently converted into a low-k material during a post patterning cure. In this way, the inventive method avoids plasma etching and the complex sacrificial film stack and processes required for patterning. Specifically, this invention relates to a simplified method of fabricating single-damascene and dual-damascene low-k interconnect structures with at least one patternable dielectric.

In general terms, a method is provided that comprises depositing at least one patternable low-k material on a surface of an inorganic antireflective coating (ARC) that is located atop a substrate, said inorganic ARC is liquid deposited and comprises a polymer that has at least one monomer unit comprising the formula $M-R^1$ wherein M is at least one of Si, Ge, B, Sn, Fe, Ta, Ti, Ni, Hf and La and $R^1$ is a chromophore; forming at least one interconnect pattern within said at least one patternable low-k material, said at least one interconnect pattern is formed without utilizing a separate photoresist material; and curing the at least one patternable low-k material as well as the ARC. The inventive method can be used to form dual-damascene interconnect structures as well as single-damascene interconnect structures.

In other embodiments of the present invention, the ARC may also include at least one second monomer unit, in addition to the at least one monomer unit represented by the formula $M-R^1$. When present, the at least one second monomer unit has the formula $M'-R^2$, wherein M' is at least one of Si, Ge, B, Sn, Fe, Ta, Ti, Ni, Hf and La, and $R^2$ is a cross-linking agent. M and M' may be the same or different elements. In these two formulae, M and M' within the monomer unit may be also be bonded to organic ligands including atoms of C and H, a cross-linking component, a chromophore or mixtures thereof. The organic ligands may further include one of O, N, S and F. When the organic ligand is bonded to M and M', it is bonded to M or M' through C, O, N, S, or F.

The liquid ARC composition comprising $M-R^1$ or $M-R^1$ and $M'-R^2$ may also comprise at least one additional component, including a separate crosslinker, an acid generator or a solvent.

The present invention will now be described in reference to FIGS. 1A-1F which illustrate an embodiment of the present invention in which a dual-damascene structure using patternable dielectrics as on-chip electrical insulators on a semiconductor chip is provided.

FIG. 1A illustrates an initial structure 10 that is utilized in this embodiment of the present invention. The initial structure 10 includes a substrate 12, an optional dielectric cap 14 located on a surface of substrate 12, and inorganic antireflective coating 16 located on a surface of the optional dielectric cap 14.

The substrate 12 may comprise a semiconducting material, an insulating material, a conductive material or any combination thereof (e.g., a lower level of an interconnect structure). When the substrate 12 is comprised of a semiconducting material, any semiconductor such as Si, SiGe, SiGeC, SiC, Ge alloys, GaAs, InAs, InP and other III/V or II/VI compound semiconductors and organic semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate 12 is an insulating material, the insulating material can be an organic insulator, an inorganic insulator or a combination thereof including multilayers. The substrate 12 may also include a patternable low-k dielectric material of this invention as well. When the substrate 12 is a conducting material, the substrate may include, for example, polySi, an elemental metal, alloys of elemental metals, a metallic silicide, a metallic nitride, conductive nanotubes or nanowires or combinations thereof including multilayers. When the substrate 12 comprises a semiconducting material, one or more semiconductor devices such as, for example, complementary metal oxide semiconductor (CMOS) devices can be fabricated thereon.

The optional dielectric cap 14 is formed on the surface of substrate 12 utilizing a conventional deposition process such as, for example, chemical vapor deposition (CYD), plasma enhanced chemical vapor deposition (PECVD), atomic layer deposition (ALD), chemical solution deposition, spin coating, brush coating, spray coating, dip coating, or evaporation. The dielectric cap 14 comprises any suitable dielectric capping material such as, for example, SiC, SiN, $SiO_2$, a carbon doped oxide, a nitrogen and hydrogen doped silicon carbide SiC(N,H) or multilayers thereof. This dielectric cap can be a continuous layer or a discontinuous layer. It can also be a select cap, such as CoWP, on top of the metal area only. The thickness of the dielectric cap 14 may vary depending on the technique used to form the same as well as the material make-up of the layer. Typically, the dielectric cap 14 has a thickness from about 15 to about 55 nm, with a thickness from about 25 to about 45 nm being more typical.

Next, an inorganic antireflective coating (ARC) 16 is formed on a surface of the optional dielectric cap 14 if present, or directly on a surface of the substrate 12 when the dielectric cap 14 is not present. The ARC 16 may be designed to control reflection of light that is transmitted through the patternable low-k film (to be subsequently formed), reflected off the substrate and back into the patternable low-k film, where it can interfere with incoming light and cause the low-k film to be unevenly exposed. The ARC's optical constants are defined here as the index of refraction n and the extinction coefficient k. In general, ARC 16 can be modeled so as to find optimum optical parameters (n and k values) of ARC as well as optimum thickness. The preferred optical constants of the ARC 16 are in the range from about n=1.4 to n=2.6 and k=0.01 to k=0.78 at a wavelength of 248, 193 and 157, 126 nm and extreme ultraviolet (13.4 nm) radiation.

The optical properties and thickness of ARC 16 is optimized to obtain optimal resolution and profile control of the patternable low-k material during the subsequent patterning steps, which is well known to those ordinarily skilled in the art. The thickness of the ARC 16 may vary depending on the technique used to form the same as well as the material make-up of the layer. Typically, the ARC 16 has a thickness from about 5 to about 200 nm, with a thickness from about 20 to about 140 nm being more typical.

The ARC 16 of the present invention is formed by a liquid deposition process including for example, spin-on coating, spray coating, dip coating, brush coating, evaporation or chemical solution deposition. The ARC 16 comprises a polymer that has at least one monomer unit comprising the formula M-$R^1$ wherein M is at least one of Si, Ge, B, Sn, Fe, Ta, Ti, Ni, Hf and La and $R^1$ is a chromophore. In some embodiments, M within the monomer unit may also be bonded to organic ligands including atoms of C and H, a cross-linking component, another chromophore or mixtures thereof. The organic ligands may further include one of O, N, S and F. When the organic ligand is bonded to M, it is bonded to M through C, O, N, S, or F.

In other embodiments of the present invention, the ARC may also include at least one second monomer unit, in addition to the at least one monomer unit represented by the formula M-$R^1$. When present, the at least one second monomer unit has the formula M'-$R^2$, wherein M' is at least one of Si, Ge, B, Sn, Fe, Ta, Ti, Ni, Hf and La, and $R^2$ is a cross-linking agent. M and M' may be the same or different elements. In these two formulae, M and M' within the monomer unit may be also be bonded to organic ligands including atoms of C and H, a cross-linking component, a chromophore or mixtures thereof. The organic ligands may further include one of O, N, S and F. When the organic ligand is bonded to M and M', it is bonded to M or M' through C, O, N, S, or F.

The liquid ARC composition comprising M-$R^1$ or M-$R^1$ and M'-$R^2$ may also comprise at least one additional component, including a separate crosslinker, an acid generator or a solvent.

The ARC 16 is formed by liquid phase deposition of a liquid composition that includes an inorganic precursor that includes atoms of M, C and H, wherein M is at least one of Si, Ge, B, Sn, Fe, Ta, Ti, Ni, Hf and La. The inorganic precursor used in forming the ARC may optionally include atoms of O, N, S, F or mixtures thereof. In some embodiments, M is preferably Si. The liquid composition also includes, in addition to the inorganic precursor, a chromophore, a cross-linking component and an acid generator.

One embodiment of the inventive inorganic ARC composition comprises M-$R^1$ and M'-$R^2$ units, wherein M and M' is at least one of Si, Ge, B, Sn, Fe, Ta, Ti, Ni, Hf and La or is selected from Group IIIB to Group VIB, Group IIIA, Group IVA. The inorganic precursor used in forming the ARC may optionally include atoms of O, N, S, F or mixtures thereof. One embodiment of inventive inorganic ARC composition comprises the $MO_y$ unit which can be any one of many different metal-oxide forms. An exemplary list of such metal-oxide forms for a particular metal is as follows:

$MO_3$; wherein M is Sc, Y, lanthanide, and Group IIIA; B, Al, Ga or In.

$MO_4$; wherein M is Group IVB; Ti, Zr or Hf and Group IVA; Sn or Ge.

$MO_5$; wherein M is Group VB; V, Nb or Ta; or P. The Group VB metals are also known to form stable metal oxo forms, LMO3, wherein L is an oxo.

LMO; many of the listed metals form stable acetoacetato-metal complexes.

LMO; many of the listed metals form stable cyclopentadienyl-metal complexes.

LMO; wherein L is an alkoxy ligand; M is Sc, Y, or lanthanide, Group IVB, and Group VB.

LMO; wherein L is an alkyl or phenyl ligand; M is Group IIIA or Group IVA.

The chromophore, cross-linking component and acid generator that can be used in the present invention are defined in greater detail with respect to the following preferred embodiment of the present invention.

In a preferred embodiment, the ARC 16 is characterized by the presence of an SiO-containing polymer having pendant chromophore moieties. The polymer containing SiO moieties may be a polymer containing SiO moieties in the polymer backbone and/or in pendant groups. Preferably, the polymer contains SiO moieties in its backbone. The polymer is preferably a siloxane, a silane, a carbosilane, an oxycarbosilane, an organosilicate, a silsesquioxane, or an organosiloxane, more preferably organosilsesquioxane. The polymer should have solution and film-forming characteristics conducive to forming a layer by conventional spin-coating. In addition to the chromophore moieties discussed below, the SiO-containing polymer also preferably contains a plurality of reactive sites distributed along the polymer for reaction with the cross-linking component.

Examples of suitable polymers include polymers having the silsesquioxane (ladder or network) structure. Such polymers preferably contain monomers having structures (I) and (II) below:

(I)

(II)

where $R_1$ comprises a chromophore and $R_2$ comprises a reactive site for reaction with the cross-linking component.

Alternatively, general linear organosiloxane polymers containing monomers (III) and (IV) can be used:

(III)

-continued

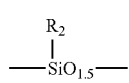
(IV)

where $R_1$ and $R_2$ are as described above. In some cases, the polymer contains various combinations of monomers (I)-(IV) such that the average structure for $R_1$-containing monomers may be represented as structure (V) below and the average structure for $R_2$-containing monomers may be represented by structure (VI) below:

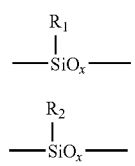

(V)

(VI)

where x is from about 1 to about 1.5. In theory, x may be greater than 1.5, however, such composition generally do not possess characteristics suitable for spin-coating processes (e.g., they form undesirable gel or precipitate phases).

Generally, silsesquioxane polymers are preferred. If the ordinary organosiloxane polymers are used (e.g., monomers of structures (III) and (IV)), then preferably, the degree of cross-linking is increased compared to formulations based on silsesquioxanes.

The chromophore-containing groups $R_1$ (or $R^1$ in the generic description above) may contain any suitable chromophore which (i) can be grafted onto the SiO-containing polymer (or M moiety of the generic monomer defined above) (ii) has suitable radiation absorption characteristics at the imaging wavelength, and (iii) does not adversely affect the performance of the layer or any overlying layers.

Preferred chromophore moieties include benzene and its derivatives, chrysenes, pyrenes, fluoranthrenes, anthrones, benzophenones, thioxanthones, and anthracenes. Anthracene derivatives, such as those described in U.S. Pat. No. 4,371, 605 may also be used; the disclosure of this patent is incorporated herein by reference. In one embodiment, phenol, hydroxystyrene, and 9-anthracene methanol are preferred chromophores. The chromophore moiety preferably does not contain nitrogen, except for possibly deactivated amino nitrogen such as in phenol thiazine.

The chromophore moieties may be chemically attached by acid-catalyzed O-alkylation or C-alkylation such as by Friedel-Crafts alkylation. The chromophore moieties may also be chemically attached by hydrosilylation of SiH bond on the parent polymer. Alternatively, the chromophore moiety may be attached by an esterification mechanism. A preferred acid for Friedel-Crafts catalysis is HCl.

Preferably, about 15 to about 40% of the functional groups contain chromophore moieties. In some instances, it may be possible to bond the chromophore to the monomer before formation of the SiO-containing polymer. The site for attachment of the chromophore is preferably an aromatic group such as a hydroxybenzyl or hydroxymethylbenzyl group. Alternatively, the chromophore may be attached by reaction with other moieties such as cyclohexanol or other alcohols. The reaction to attach the chromophore is preferably an esterification of the alcoholic OH group.

$R_2$ (or $R^2$ in the generic description above) comprises a reactive site for reaction with the cross-linking component. Preferred reactive moieties contained in $R_2$ are alcohols, more preferably aromatic alcohols (e.g., hydroxybenzyl, phenol, hydroxymethylbenzyl, etc.) or cycloaliphatic alcohols (e.g., cyclohexanoyl). Alternatively, non-cyclic alcohols such as fluorocarbon alcohols, aliphatic alcohols, amino groups, vinyl ethers, and epoxides may be used.

Preferably, the SiO-containing polymer (before attachment of the chromophore) is poly(4-hydroxybenzylsilsesquioxane), Examples of other silsesquioxane polymers of the invention include: poly(p-hydroxyphenylethylsilsesquioxane), poly(p-hydroxyphenylethylsilsesquioxane-co-p-hydroxy-alpha-methylbenzylsilsesquioxane), poly(p-hydroxyphenylethylsilsesquioxane-co-methoxybenzylsilsesquioxane), poly(p-hydroxyphenylethylsilsesquioxane-co-t-butylsilsesquioxane), poly(p-hydroxyphenylethylsilsesquioxane-co-cyclohexylsilsesquioxane), poly(p-hydroxyphenylethylsilsesquioxane-co-phenylsilsesquioxane), poly(p-hydroxyphenylethylsilsesquioxane-co-bicycloheptylsilsesquioxane), poly(p-hydroxy-alpha-methylbenzylsilsesquioxane), poly(p-hydroxy-alpha-methylbenzylsilsesquioxane-co-p-hydroxybenzylsilsesquioxane), poly(p-hydroxy-alpha-methylbenzylsilsesquioxane-co-methoxybenzylsilsesquioxane), poly(p-hydroxy-alpha-methylbenzylsilsesquioxane-co-t-butylsilsesquioxane), poly(p-hydroxy-alpha-methylbenzylsilsesquioxane-co-cyclohexylsilsesquioxane), poly(p-hydroxy-alpha-methylbenzylsilsesquioxane-co-phenylsilsesquioxane), poly(p-hydroxy-alpha-methylbenzylsilsesquioxane-co-bicycloheptylsilsesquioxane), poly(p-hydroxybenzylsilsesquioxane-co-p-hydroxyphenylethylsilsesquioxane), and poly(p-hydroxy-alpha-methylbenzylsilsesquioxane-co-alpha-methylbenzylsilsesquioxane).

The SiO-containing polymers of the invention preferably have a weight average molecular weight, before reaction with the cross-linking component, of at least about 1000, more preferably a weight average molecular weight of about 1000-10000.

The cross-linking component is preferably a crosslinker that can be reacted with the SiO containing polymer in a manner which is catalyzed by generated acid and/or by heating. Generally, the cross-linking component used in the anti-reflective compositions of the invention may be any suitable cross-linking agent known in the negative photoresist art which is otherwise compatible with the other selected components of the composition. The cross-linking agents preferably act to crosslink the polymer component in the presence of a generated acid. Preferred cross-linking agents are glycoluril compounds such as tetramethoxymethyl glycoluril, methylpropyltetramethoxymethyl glycoluril, and methylphenyltetramethoxymethyl glycoluril, available under the POWDERLINK trademark from American Cyanamid Company. Other possible cross-linking agents include: 2,6-bis (hydroxymethyl)-p-cresol, compounds having the following structures:

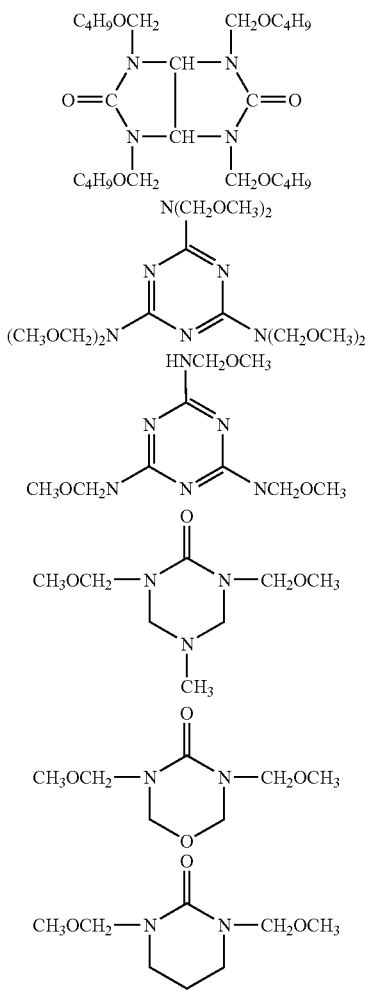

including their analogs and derivatives, such as those found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycolurils, for example as can be found in Canadian Patent No. 1 204 547. Other cross-linking agents such as bis-epoxies or bis-phenols (e.g., bisphenol-A) may also be used. Combinations of cross-linking agents may be used.

The acid generator is preferably an acid generator compound that liberates acid upon thermal treatment. A variety of known thermal acid generators are suitably employed such as, for example, 2,4,4,6-tetrabromocyclohexadienone, benzoin tosylate, 2-nitrobenzyl tosylate and other alkyl esters of organic sulfonic acids, blocked alkyl phosphoric acids, blocked perfluoroalkyl sulfonic acids, alkyl phosphoric acid/amine complexes, perfluoroalkyl acid quats wherein the blocking can be by covalent bonds, amine and quaternary ammonium. Compounds that generate a sulfonic acid upon activation are generally suitable. Other suitable thermally activated acid generators are described in U.S. Pat. Nos. 5,886,102 and 5,939,236; the disclosures of these two patents are incorporated herein by reference. If desired, a radiation-sensitive acid generator may be employed as an alternative to a thermally activated acid generator or in combination with a thermally activated acid generator. Examples of suitable radiation-sensitive acid generators are described in U.S. Pat. Nos. 5,886,102 and 5,939,236. Other radiation-sensitive acid generators known in the resist art may also be used as long as they are compatible with the other components of the antireflective composition. Where a radiation-sensitive acid generator is used, the cure (cross-linking) temperature of the composition may be reduced by application of appropriate radiation to induce acid generation which in turn catalyzes the cross-linking reaction. Even if a radiation-sensitive acid generator is used, it is preferred to thermally treat the composition to accelerate the cross-linking process (e.g., for wafers in a production line).

The antireflective compositions of the invention preferably contain (on a solids basis) (i) from about 50 to about 98 wt. % of a polymer including M, more preferably from about 70 to about 80 wt. %, (ii) from about 1 to about 50 wt. % of cross-linking component, more preferably from about 3 to about 25%, most preferably about from about 5 to about 25 wt. %, and (iii) from about 1 to about 20 wt. % acid generator, more preferably about 1-15 wt. %.

The ARC 16 of the present invention is formed by a liquid deposition process including for example, spin-on coating, spray coating, dip coating, brush coating, evaporation or chemical solution deposition. After applying the ARC 16, a post deposition baking step is typically, but not necessarily always, required to remove unwanted components, such as solvent, and to effect crosslinking. When performed, the baking step is conducted at a temperature from about 60° to about 400° C., with a baking temperature from about 80° to about 300° C. being even more preferred. The duration of the baking step varies and is not critical to the practice of the present invention. The as-deposited ARC 16 may further undergo a curing process. The curing is performed in the present invention by a thermal cure, an electron beam cure, an ultra-violet (UV) cure, an ion beam cure, a plasma cure, a microwave cure or any combination thereof.

In addition, the composition of the starting precursor as well as the introduction of oxygen, nitrogen, fluorine containing precursors also allows the tunability of these films. The ARC's optical constants are defined here as the index of refraction n and the extinction coefficient k. In general, ARC 16 can be modeled so as to find optimum optical parameters (n and k values) of ARC as well as optimum thickness. As mentioned above, the preferred optical constants of the ARC 15 are in the range from about n=1.4 to n=2.6 and k=0.01 to k=0.78 at a wavelength of 248, 193 and 157, 126 nm and extreme ultraviolet (13.4 µm) radiation.

In addition to the above, the ARC 16 does not interact with the patternable low-k material to induce residue, footing or undercutting. Moreover, the ARC 16 has good etch selectivity to the patternable dielectric material. Etch selectivities of 1.5-4 to 1 of the ARC to low-k dielectric material can be obtained. Furthermore, the use of the ARC 16 of the present invention maintains the pattern and structural integrity after curing of the patternable low-k material. This is critical as the ARC layer 16 is retained as a permanent part of the final interconnect stack. Another beneficial attribute of the inventive ARC is that it has a relative dielectric constant that is less than 7.0.

Figure 1B:
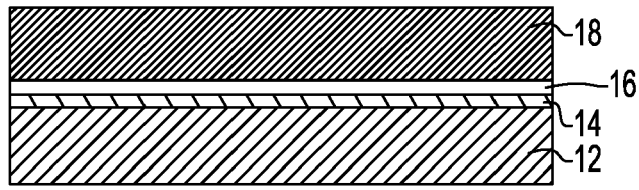

Next, and as illustrated in FIG. 1B, a first patternable low-k material 18, which combines the function of a photoresist and low-k material into one single material is provided. As shown, the first patternable low-k material 18 is provided directly on the surface of the ARC 16.

The first patternable low-k material 18 is provided (i.e., formed) utilizing a conventional deposition process including, for example, spin-on-coating, spray coating, dip coating, brush coating, evaporation. After applying the first patternable low-k material 18, a post deposition baking step is typically, but not necessarily always, required to remove unwanted components, such as solvent. When performed, the baking step is conducted at a temperature from about 60° to about 200° C., with a baking temperature from about 80° to about 160° C. being even more preferred. The duration of the baking step varies and is not critical to the practice of the present invention.

The thickness of the first patternable low-k material 18 may vary depending on the technique used to form the same as well as the material make-up of the layer. Typically, the first patternable low-k material 18 has a thickness from about 10 to about 10000 nm, with a thickness from about 50 to about 2000 nm being more typical.

As stated above, the first patternable low-k material 18 functions as a photoresist and is converted into a low-k material during post patterning processing, UV light, electron beam, ion beam, microwave, plasma cure, thermal cure or combinations thereof. For instance, the first patternable low-k material 18 may comprise a functionalized polymer having one or more acid-sensitive imageable groups. These polymers or blends of polymers can be converted into low-k materials after subsequent processing.

More specifically, the first patternable low-k material 18 comprises photo/acid-sensitive polymers of hydrocarbons, fluorinated hydrocarbons, siloxane, silane, carbosilane, oxycarbosilane, organosilicates, silsesquioxanes and the like. The polymers include, for example, silsesquioxane-type polymers including caged, linear, branched or combinations thereof. In one embodiment, the first patternable dielectric material 18 comprises a blend of these photo/acid-sensitive polymers. The first patternable dielectric material 18 may further comprises at least one sacrificial pore generator to reduce the dielectric constant in its cured form. Examples of patternable dielectric materials useable with the present disclosure are disclosed in U.S. Pat. Nos. 7,041,748, 7,056,840, and 6,087,064, all of which are incorporated herein by reference in their entirety. The dielectric constant of the patternable low-k material 18 after cure is generally no more than 4.3. The dielectric constant may be greater than 1 and up to about 4.3, more preferably from about 1 to about 3.6, even more preferably from about 1 to about 3.0, further more preferably from about 1 to about 2.5, with from about 1 to about 2.0 being most preferred.

The first patternable low-k material 18 is formed from a composition that includes one of the above mentioned polymers or polymer blends, a photoacid generator, a base additive and a solvent typically used in a photoresist. The photoacid generators, base additives and solvents are well known to those skilled in the art and, as such, details regarding those components are not fully provided.

In a preferred embodiment, the first patternable low-k material 18 is a negative-tone patternable low-k material comprising a silsesquioxane polymer or copolymer including, for example, poly(methylsilsesquioxane) (PMS), poly(p-hydroxybenzylsilsesquioxane) (PHBS), poly(p-hydroxyphenylethylsilsesquioxane) (PHPES), poly(p-hydroxyphenylethylsilsesquioxane-co-p-hydroxy-alpha-methylbenzyl silsesquioxane) (PHPE/HMBS), poly(p-hydroxyphenylethylsilsesquioxane-co-methoxybenzylsilsesquioxane) (PHPE/MBS), poly(p-hydroxyphenylethylsilsesquioxane-co-t-butylsilsesquioxane) (PHPE/BS), poly(p-hydroxyphenylethylsilsesquioxane-co-cyclohexylsilsesquioxane) (PHPE/CHS), poly(p-hydroxyphenylethylsilsesquioxane-co-phenylsilsesquioxane) (PHPE/PS), poly(p-hydroxyphenylethylsilsesquioxane-co-bicycloheptylsilsesquioxane) (PHPE/BHS), polyp-hydroxy-alpha-methylbenzylsilsesquioxane) (PHMBS), polyp-hydroxy-alpha-methybenzylsilsesquioxane-co-p-hydroxybenzylsilsesquioxane) (PHMB/HBS), poly(p-hydroxy-alpha-methylbenzylsilsesquioxane-co-methoxybenzylsilsesquioxane) (PHIMB/MBS), poly(p-hydroxy-alplha-methylbenzylsilsesquioxane-co-t-butylsilsesquioxane) (PHMB/BS), poly(p-hydroxy-alpha-methylbenzylsilsesquioxane-co-cyclohexylsilsesquioxane) (PHMB/CHS), poly(p-hydroxy-alpha-metylbenzylsilsesquioxane-co-phenylsilsesquioxane) (PHMB/PS), poly(p-hydroxy-alpha-methylbenzylsilsesquioxane-co-bicycloheptylsilsesquioxane) (PHMB/BHS), poly(p-hydroxybenzylsilsesquioxane-co-p-hydroxyphenylethylsilsesquioxane) (PHB/HPES), and poly(p-hydroxy-alpha-methylbenzylsilsesquioxane-co-p-alpha-methyl-benzylsilsesquioxane) (PHMB/MBS).

In the compositions containing a blended polymer component, the silsesquioxane polymer in the blend may be selected from the silsesquioxane polymers described above or may be selected from other silsesquioxane polymers such as, for example, poly(methylsilsesquioxane) (PMS), poly(p-hydroxybenzylsilsesquioxane) (PHBS), poly(p-hydroxybenzylsilsesquioxane-co-methoxybenzylsilsesquioxane) (PHB/MBS), polyp-hydroxy-alpha-methylbenzylsilsesquioxane-co-p-alpha-methybenzylsilsesquioxane) (PHMB/MBS), poly(p-hydroxybenzylsilsesquioxane-co-t-butylsilsesquioxane) (PHB/BS), poly(p-hydroxybenzylsilsesquioxane-co-cyclohexylsilsesquioxane) (PHB/CHS), poly(p-hydrooxybenzylsilsesquioxane-co-phenylsilsesquioxane) (PHB/PS), poly(p-hydroxybenzylsilsesquioxane-co-bicycloheptylsilsesquioxane) (PHB/BHS), and caged silsesquioxanes such as octakis(glycidyloxypropyl) dimethylsilyloxy)silsesquioxane, octakis[cyclohexenyl epoxide) dimethylsilyloxy]silsesquioxane, octakis[4-(hydroxyphenylethyl) dimethylsilyloxy]silsesquioxane, and octakis[{2-(1',1'-bis(trifluoromethyl)-1'-hydroxyethyl) norbornyl}dimethylsilyloxy]silsesquioxane. If desired, a combination of different silsesquioxane polymers may be used in the blend with the non-silsesquioxane polymer.

For positive tone patternable low-k material, the silicon-containing polymer employed in the present invention may be a homopolymer or a copolymer. Suitable types of such silicon-containing polymers include homopolymers or copolymers containing at least one monomer selected from the group consisting of a siloxane, a silane, a silsesquioxane and a silyne. Highly preferred silicon-backbone polymers are selected from the group consisting of poly(hydroxyphenyl alkyl)silsesquioxanes and poly (hydroxyphenyl alkyl) siloxanes, wherein the alkyl is a $C_{1-30}$ moiety. These preferred silicon-containing polymers are preferably fully or partially protected with acid-sensitive protecting groups.

The positive-tone patternable low-k material may comprise blends of a non-silicon containing polymer and a silicon-containing polymeric additive with a silicon-containing substituent bonded to the polymeric backbone, the silicon-containing polymeric additive may be a homopolymer or copolymer containing at least one monomer having a silicon-containing substituent. The silicon-containing substituent may or may not be acid sensitive. Typically, however the substituent is acid sensitive when containing a $C_2$ alkyl moiety. Preferably, the silicon-containing substituent is attached to a monomer selected from the group consisting of hydroxystyrene, an acrylate, a methacrylate, an acrylamide, a methacrylamide, itaconate an itaconic half ester or a cycloolefin.

Preferred silicon-containing substituents include: siloxane, silane and cubic silsesquioxanes. The silicon-containing polymer may further include silicon-free monomers such as those selected from the group consisting of styrene, hydroxystyrene, acrylic acid, methacrylic acid, itaconic acid and an anhydride such as maleic anhydride and itaconic anhydride.

Preferred monomers containing silicon-containing substituents are trimethylsilyl alkyl acrylate, trimethylsilyl alkyl methacrylate, trimethylsilyl alkyl itaconate, tris(trimethylsilyl)silyl alkyl acrylate tris(trimethylsilyl)silyl alkyl methacrylate, tris(trimethylsilyl)silyl alkyl itaconate, tris(trimethylsilyloxy)silyl alkyl acrylate, tris(trimethylsilyloxy)silyl alkyl methacrylate, tris(trimethylsilyloxy)silyl alkyl itaconate, alkylsilyl styrene, trimethylsilylmethyl(dimethoxy)silyloxy alkyl acrylate, trimethylsilylmethyl(dimethoxy)silyloxy alkyl methacrylate, trimethylsilylmethyl(dimethoxy)silyloxy alkyl itaconate, trimethylsilyl alkyl norbornene-5-carboxylate alkyl, tris(trimethylsilyl(silyl alkyl norbornene-5-carboxylate and tris(trimethylsilyloxy)silyl alkyl norbornene-5-carboxylate, wherein alkyl is a $C_{1-5}$ moiety.

Highly preferred species of these monomers are 3-(3,5,7, 9,11,13,15-heptacyclopentylpentacyclo[9.5.1.13,9.15, 15.17,13]-octasiloxan-1-yl)propyl methacrylate, 1,3,5,7,9, 11,13-heptacyclopentyl-15-vinylpentacyclo[9.5.1.13,9.15, 15.17,13]octasiloxane, methacrylamidotrimethylsilane, O-(methacryloxyethyl)-N-(triethoxysilylpropyl)urethane, methacryloxyethoxytrimethylsilane, N-(3-methacryloxy-2-hydroxypropyl)-3-aminopropyltriethoxysilane, (methacryloxymethyl)bis(trimethylsiloxy)methylsilane, (m,p-vinylbenzyloxy)trimethylsilane, methacryloxypropyltris(trimethylsiloxy)silane, methacryloxytrimethylsilane, 3-methacryloxypropylbis(trimethylsiloxy)methylsilane, 3-methacryloxypropyldimethylchlorosilane, methacryloxypropyldimethylethoxysilane, methacryloxypropyldimethylmethoxysilane, methacryloxypropylheptacyclopentyl-T8-silsequioxane, methacryloxypropylmethyldichlorosilane, methacryloxypropylmethyldiethoxysilane, methacryloxypropylmethyldimethoxysilane, (methacryloxymethyl)dimethylethoxysilane, (methacryloxymethyl)phenyldimethylsilane(phenyldimethylsilyl)methylmethaerylate, methacryloxymethyltriethoxysilane, methacryloxymethyltrimethoxysilane, methacryloxymethyltris(trimethylsiloxy)silane, O-methacryloxy(polyethyleneoxy)trimethylsilane, methacryloxypropylpentamethyldisiloxane, methacryloxypropylsilatrane, methacryloxypropylsiloxane macromer, methacryloxypropyl terminated polydimethylsiloxane, methacryloxypropyltrichlorosilane, methacryloxypropyltriethoxysilane, methacryloxypropyltrimethoxysilane, methacryloxypropyltris(methoxyethoxy)silane, p-(t-butyldimethylsiloxy)styrene, butenyltriethoxysilane, 3-butenyltrimethylsilane, (3-acryloxypropyl)trimethoxysilane, (3-acryloxypropyl)tris(trimethylsiloxy)silane, O-(trimethylsilyl)acrylate, 2-trimethylsiloxyethlacrylate, N-(3-acryloxy-2-hydroxypropyl)-3-aminopropyltriethoxysilane, (3-acryloxypropyl)dimethylmethoxysilane, (3-acryloxypropyl)methylbis(trimethylsiloxy)silane, (3-acryloxypropyl)methyldichlorosilane, and (3-acryloxypropyl)methyldimethoxysilane, (3-acryloxypropyl)trichlorosilane.

The extent of protection and the amount of co-monomer present in the silicon containing polymeric additive are such that the patternable low-k material resist composition will provide good lithography performance, i.e., high resolution and good process window Examples of protecting groups which can be employed are cyclic and branched (secondary and tertiary) aliphatic carbonyls, esters or ethers containing from 3 to 30 carbon atoms, acetals, ketals and aliphatic silylethers.

Examples of cyclic or branched aliphatic carbonyls that may be employed in the present invention include, but are not limited to phenolic carbonates; t-alkoxycarbonyloxys such as t-butoxylcarbonyloxy and isopropyloxycarbonyloxy. A highly preferred carbonate is t-butoxylcarbonyloxy.

Some examples of cyclic and branched ethers that may be employed in the present invention include, but are not limited to: benzyl ether and t-alkyl ethers such t-butyl ether. Of the aforesaid ethers, it is highly preferred to use t-butyl ether.

Examples of cyclic and branched esters that can be employed in the present invention are carboxylic esters having a cyclic or branched aliphatic substituent such as t-butyl ester, isobornyl ester, 2-methyl-2-admantyl ester, benzyl ester, 3-oxocyclohexanyl ester, dimethylpropylmethyl ester, mevalonic lactonyl ester, 3-hydroxy-g-butyrolactonyl ester, 3-methyl-g-butylrolactonyl ester, bis(trimethylsilyl)isopropyl ester, trimethylsilylethyl ester, tris(trimethylsilyl)silylethyl ester and cumyl ester.

Some examples of acetals and ketals that can be employed in the present invention include, but are not limited to: phenolic acetals and ketals as well as tetrahydrofuranyl, tetrahydropyranyl, 2-ethoxyethyl, methoxycyclohexanyl, methoxycyclopentanyl, cyclohexanyloxyethyl, ethoxycyclopentanyl, ethoxycyclohexanyl, methoxycycloheptanyl and ethoxycycloheptanyl. Of these, it is preferred that a methoxycyclohexanyl ketal be employed, Illustrative examples of silylethers that can be employed in the present invention include, but are not limited to: trimethylsilylether, dimethylethylsilylether and dimethylpropylsilylether. Of these silylethers, it is preferred that trimethylsilylether be employed.

In a preferred embodiment for negative-tone patternable low-k materials of the present invention are two miscible, or compatible, silsesquioxanes. The first silsesquioxane polymer is a linear, branched, caged compound or combination thereof having the following structural formula:

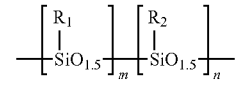

wherein each occurrence of $R_1$ is one or more acidic functional groups for base solubility; each occurrence of $R_2$ is a carbon functionality for controlling polymer dissolution in an aqueous base; $R_1$ is not equal to $R_2$; m and n represent the number of repeating units; m is an integer; and n is zero or an integer greater than zero.

In the present invention, $R_1$ is not limited to any specific functional group, and is preferably selected from among linear or branched alkyls which are substituted with OH, C(O) OH, and/or F; cycloalkyls which are substituted with OH, C(O)OH, and/or F; aromatics which are substituted with OH, C(O)OH, and/or F; arenes that are substituted with OH, C(O) OH, and/or F; and acrylics which are substituted with OH, C(O)OH, and/or F. Examples of preferred $R_1$ include:

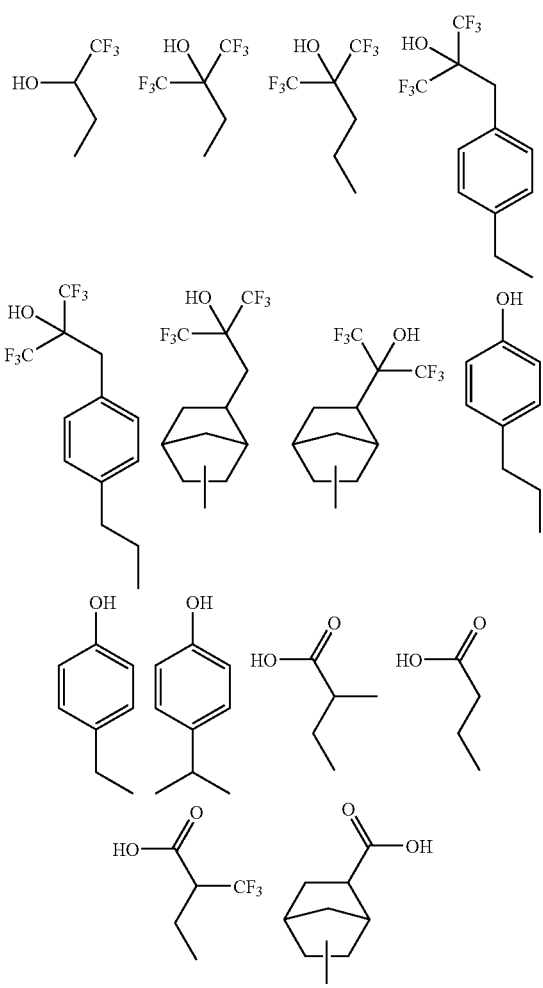

In the present invention, $R_2$ is not limited to any specific carbon functional group, and is preferably selected from among linear or branched alkyls, cylcoalkyls, aromatics, arenes, and acrylates.

The silsesquioxane polymers of the present invention have a weight averaged molecular weight of about 400 to about 500,000, and more preferable from about 1500 to about 10,000. The $R_1$ and $R_2$ proportions and structures are selected to provide a material suitable for photolithographic processes and maintaining pattern fidelity after post patterning cure.

A second polymer component of the blend material includes but is not limited to a family of organosilicates known as silsesquioxanes, having the structural formula:

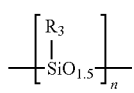

wherein $R_3$ is preferable selected from alkyls, cycloalkyls, aryl, or a combination thereof and are commercially available from Dow Corning, Shin-Etsu, or JSR, for example. The silsesquioxane is preferably poly(methylsilsesquioxane), and n is an integer about 10 to about 1,000 or more (including copolymers). The silsesquioxane polymers possess silanol end groups, but may also include halosilanes, acetoxysilanes, silylamines, and alkoxysilanes. In a preferred embodiment of the present invention, silsesquioxane polymers, LKD-2021 or LKD-2056 (from JSR Corporation) which contain silanol end groups are employed.

A third component of the present invention is a photosensitive acid generator (PAG) that is compatible with the other components. Examples of preferred PAGs include: -(trifluoro-methylsulfonyloxy)-bicyclo[2.2.1]hept-5-ene-2,3-dicarboximide (MDT), onium salts, aromatic diazonium salts, sulfonium salts, diaryliodonium salts, and sulfonic acid esters of N-hydroxyamides or -imides, as disclosed in U.S. Pat. No. 4,371,605. The content of the '605 patent is incorporated herein by reference. A weaker acid generated from a PAG such as N-hydroxy-naphthalimide (DDSN) may be used. Combinations of PAGs may be used.

The composition of the silsesquioxane polymers in the blend formulation is 1 to 99% of the total polymer composition. In the preferred embodiment of the invention, the composition of the acid sensitive polymer is 20 to 80% of the total polymer composition, and even more preferred, 30 to 60%.

A third component of the patternable low-k composition of the present invention is a pore-generating compound, called a porogen. The porogen provides nanoscopic pores in the composition of matter of the present invention which further reduces the dielectric constant of the material.

The porogen that can be used in the present invention includes miscible or phase separated, i.e., non-miscible, polymers that are capable of decomposing under heat or radiation. Alternatively, the porogen may be extracted with supercritical fluid techniques. Examples of porogens that may be employed in the present invention include: homopolymers, copolymers, organic nanoscopic polymers, thermoplastic polymers, star-shaped polymers, dendrimers or crosslinked polymers that remain substantially dormant during the patterning process. After patterning, the pore generating polymers are decomposed or extracted to enhance the dielectric properties of the material of the present invention without severely degrading the pattern fidelity. The decomposition of the porogen may be by heat or radiation-induced.

When a porogen is employed, it is present in the composition of the present invention in an amount of from about 0.1 to about 99.9% of the functionalized polymer. More preferably, the porogen is present in an amount of from about 5 to about 90% of the functionalized polymer.

A fourth component of the present invention is a photosensitive acid generator (PAG) that is compatible with the other components. Examples of preferred PAGs include: -(trifluoro-methylsulfonyloxy)-bicyclo[2.2.1]hept-5-ene-2,3-dicarboximide (MDT), onium salts, aromatic diazonium salts, sulfonium salts, diaryliodonium salts, and sulfonic acid esters of N-hydroxyamides or -imides, as disclosed in U.S. Pat. No. 4,371,605. The content of the '605 patent is incorporated herein by reference. A weaker acid generated from a PAG such as N-hydroxy-naphthalimide (DDSN) may be used. Combinations of PAGs may be used.

Condensation in the presence of an acid generated by a photoacid generator under exposure to radiation is not limited to silanols, but may also include halosilanes, acetoxysilanes, silylamines, and alkoxysilanes. Organic crosslinking agents, such as those described in the inorganic antireflective coating composition, including tetramethoxymethyl glycoluril, methylpropyltetramethoxymethyl glycoluril, methylphenyltetramethoxymethyl glycoluril, (available under the POWDERLINK trademark from American Cyanamid Company) and 2,6-bis(hydroxymethyl)-p-cresol, may also be included in the formulation. Although photoacid generators are preferred for crosslinking, photobase generators can also be used for crosslinking silanol polymers.

The patternable low-k material of the present invention also includes a casting solvent to dissolve the other components. Examples of suitable casting solvent include and is not limited to ethoxyethylpropionate (EEP), a combination of EEP and γ-butyrolactone, propylene-glycol monomethyl-ether alcohol and acetate, propyleneglycol monopropyl alcohol and acetate, and ethyl lactate. Combinations of these solvents may also be used.

In optimizing the photolithography process, an organic base may be added to the formulation. The base employed in the present invention may be any suitable base known in the resist art. Examples of bases include tetraalkyammonium hydroxides, cetyltrimethylammonium hydroxide, and 1,8-diaminonaphthalene. The compositions of the present invention are not limited to any specific selection of base.

The term "acid-sensitive" is used throughout the application to denote imageable functional groups which undergo a chemical reaction in the presence of an acid generated by a photoacid generator under exposure to radiation. The acid-sensitive imageable functional groups employed in the present invention may include acid-sensitive positive-tone functional groups or acid-sensitive negative-tone functional groups. The negative-tone acid-sensitive functional groups are functional groups for causing a crosslinking reaction which causes the exposed areas to be insoluble in a developer to form a negative-tone relief image after development. The positive-tone acid-sensitive functional groups are acid-sensitive protecting groups which cause the exposed region to be soluble in a developer to form positive-tone relief images after development.

The aforementioned patternable low-k materials act as photoresists using patterning; they can be positive-tone or negative-tone, and sensitive to G-line, I-line, DUV (248 nm, 193 nm, 157 nm, 126 nm, and EUV (13.4 μm).

Figure 1C:
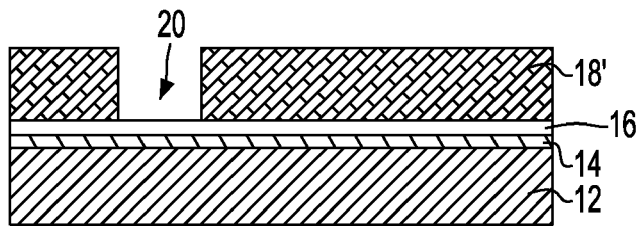

Next, and as shown in FIG. 1C, the first patternable low-k dielectric material 18 is pattern-wise exposed to form latent images of a desired circuitry. An optional post-exposure baking may be required to effect the photochemical reactions. When performed, the baking step is conducted at a temperature from about 60° to about 200° C., with a baking temperature from about 80° to about 160° C. being even more preferred. The duration of the baking step varies and is not critical to the practice of the present invention. After exposure and post-exposure baking, the latent images are developed into the low-k material with an appropriate developer, usually an aqueous base solution, such as 0.26N tetramethylammoniahydroxide (TMAH) solution.

The pattern-wise exposing process can be accomplished in a variety of ways, including, for example, through a mask with a lithography stepper or a scanner with an exposure light source of G-line, I-line (365 nm), DUV (248 nm, 193 nm, 157 nm), Extreme UV (13.4 nm) an electron beam, or an ion beam. The pattern-wise exposing process also includes direct writing without the use of a mask with, for example, light, electron beam, ion beam, and scanning probe lithography. Other patterning techniques that can be used in the present invention include contact printing techniques such as nanoimprint lithography, embroising, micro contact printing, replica molding, microtransfer molding, micromolding in capillaries and solvent-assisted micromolding, thermal assisted embroising, inject printing, and the like.

Specifically, FIG. 1C illustrates the structure that is formed after forming first interconnect patterns 20 within the patternable low-k film 18. The first interconnect patterns 20 may include at least one via opening (as shown and as preferred) or at least one line opening (not shown and less preferred than forming a via opening at this stage of the inventive method). As shown, the first interconnect patterns expose a surface of the ARC 16, if present.

After forming the first interconnect patterns, the low-k material 18 is typically, but not necessarily always, cured to form a cured low-k material 18' (See, FIG. 1C) in which the cured low-k material typically has Si atoms that are bonded to cyclic rings (aliphatic or aromatic) through oxygen atoms. This type of bonding is evident from $C^{13}$NMR or $^{29}$Si NMR. The curing is optional when the first patternable low-k material is negative-tone, but it is required when the first patternable low-k material is a positive-tone material.

Curing is performed in the present invention by a thermal cure, an electron beam cure, an ultra-violet (UV) cure, an ion beam cure, a plasma cure, a microwave cure or a combination thereof. The conditions for each of the curing processes is well known to those skilled in the art and any condition can be chosen as long as it coverts the patternable low-k material into a low-k film and maintains pattern fidelity.

In another embodiment, the irradiation cure step is performed by a combination of a thermal cure and an ultra-violet (UV) cure wherein the wavelength of the ultra-violet (UV) light is from about 50 to about 300 nm and the light source for the ultra-violet (UV) cure is a UV lamp, an excimer (exciplex) laser or a combination thereof.

The excimer laser may be generated from at least one of the excimers selected from the group consisting of $Ar_2^*$, $Kr_2^*$, $F_2$, $Xe_2^*$, ArF, KrF, XeBr, XeCl, XeCl, XeF, $CaF_2$, KrC, and $Cl_2$ wherein the wavelength of the excimer laser is in the range from about 50 to about 300 nm. Additionally, the light of the ultra-violet (UV) cure may be enhanced and/or diffused with a lens or other optical diffusing device known to those skilled in the art.

In one embodiment, this post patterning cure is a combined UV/thermal cure. This combined UV/thermal cure is carried on a UV/thermal cure module under vacuum or inert atmosphere, such as $N_2$, He, Ar. Typically, the UV/thermal cure temperature is from about 100° C. to about 500° C., with a cure temperature from about 300° to about 450° C. being more typical. The duration of the UV/thermal cure is from about 0.5 min to about 30 min with a duration from about 1 to about 10 min being more typical. The UV cure module is designed to have a very low oxygen content to avoid degradation of the resultant dielectric materials.

If the as-deposited inorganic antireflective coating 16 has been cured, the cure of the first patternable low-k material also converts the inorganic antireflective coating 16 into a dielectric material with a dielectric constant less than 7.0.

Figure 1D:
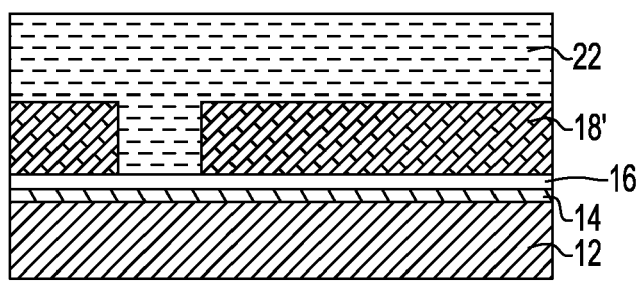

After patterning and curing the first patternable low-k material 18, a second patternable low-k material 22 is then formed providing the structure shown in FIG. 1D. The second patternable low-k material 22 may comprise the same or different material as the first patternable low-k material 18. The deposition processes and thickness mentioned above for the first patternable low-k material 18 are each applicable here for the second patternable low-k material 22. Typically, and in the embodiment illustrated, the first patternable low-k material 18 or the second low-k material 22 is either a negative-tone or a positive-tone material.

Figure 1E:
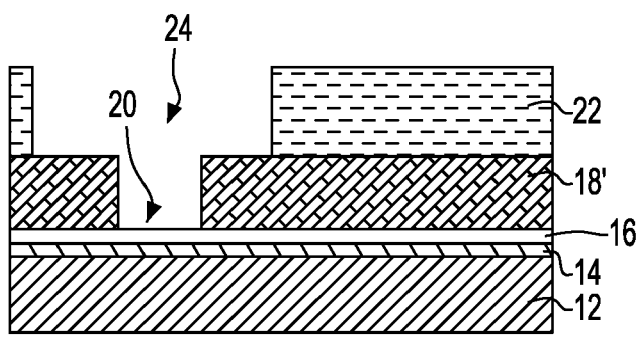

Next, and as shown in FIG. 1E, the second patternable low-k dielectric material 22 is patterned to include second interconnect patterns 24. The patterning of the second patternable low-dielectric material 22 is performed utilizing the same basic processing equipment and steps as those used for patterning the first patternable low-k dielectric material. In the illustrated embodiment, the second interconnect pattern is typically a line. The second interconnect pattern may also be a via, when the first interconnect pattern is a line.

Figure 1F:
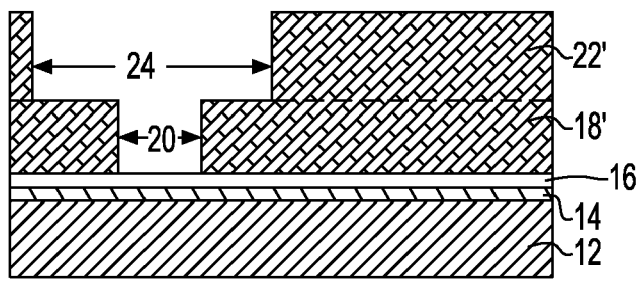

After patterning the second patternable low-k material 22, the structure is cured providing the structure shown in FIG. 1F. In FIG. 1F, reference numeral 22' denotes the cured second low-k material. Like the first cured low-k material 18', the cured second low-k material 22' has a dielectric constant within the ranges mentioned above and it also is characterized as typically having Si atoms bonding to cyclic rings (aliphatic or aromatic) via oxygen atoms. If not previously cured, this curing step also cures the first patternable low-k material 18 into a cured low-k material 18' typically having the Si bonding mentioned above. The cure methods, equipment and processes mentioned above for the first patternable low-k material 18 are each applicable here for the second patternable low-k material 22.

Figure 2:
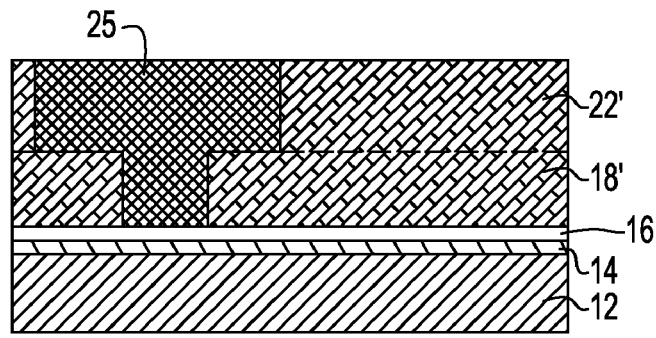
FIG. 2 shows the interconnect structure that is formed after further processing of the structure shown in FIG. 1F.

Further interconnect processing is then performed on the structure in FIG. 1F providing the structure shown in FIG. 2. This includes etching through the ARC 16 and dielectric cap 14 if present, utilizing an etching process such as, for example, reactive ion etching, or gas cluster ion beam etching. Next, a diffusion barrier liner (not shown), which may comprise Ta, TaN, Ti, TiN, Ru, RuTaN, RuTa, W, WN or any other material that can serve as a barrier to prevent conductive material from diffusing there through, is typically formed into the first and second interconnect patterns by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. In some embodiments (not shown), the diffusion barrier liner may comprise a combination of layers. The thickness of the diffusion barrier liner may vary depending on the exact means of the deposition process employed as well as the material and number of layers employed. Typically, the diffusion barrier liner has a thickness from about 4 to about 40 nm, with a thickness from about 7 to about 20 nm being more typical.

Following the formation of the diffusion barrier liner, the remaining region of the first and second interconnect patterns is filled with a conductive material 25 forming a conductive feature. The conductive material 25 used in forming the conductive feature includes, for example, polySi, a conductive metal, an alloy comprising at least one conductive metal, a conductive metal silicide, a conductive nanotube or nanowire or combinations thereof. Preferably, the first conductive material 25 that is used in forming the conductive feature is a conductive metal such as Cu, W or Al, with Cu or a Cu alloy (such as AlCu) being highly preferred in the present invention. The conductive material 25 is filled into the remaining first and second interconnect patterns utilizing a conventional deposition process including, but not limited to CVD, PECVD, sputtering, chemical solution deposition or plating.

After deposition, a conventional planarization process such as, for example, chemical mechanical polishing (CMP) can be used to provide a structure in which the diffusion barrier liner and the conductive material 25 each have an upper surface that is substantially coplanar with the upper surface of the cured second low-k material 22'.

After forming the at least one conductive material 25, another dielectric cap (not shown) is formed on the surface of the cured second low-k material 22' utilizing a conventional deposition process such as, for example, CVD, PECVD, chemical solution deposition, or evaporation. The dielectric cap comprises any suitable dielectric capping material such as, for example, SiC, SiN, $SiO_2$, a carbon doped oxide, a nitrogen and hydrogen doped silicon carbide SiC(N,H) or multilayers thereof. This dielectric cap can be a continuous layer or a discontinuous layer. It can also be a select cap, such as CoWP, on metal only. The thickness of the dielectric cap may vary depending on the technique used to form the same as well as the material make-up of the layer. Typically, the dielectric cap has a thickness from about 15 to about 55 nm, with a thickness from about 25 to about 45 nm being more typical.

In addition to the dual-damascene embodiment mentioned above, the present invention also contemplates a single-damascene embodiment which will now be described in greater detail in reference to FIGS. 3A-3D.

Figure 3A:
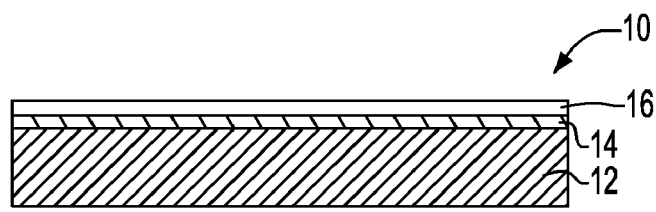
FIGS. 3A-3D are pictorial representations (through cross sectional views) depicting the basic processing steps employed for fabricating a single-damascene interconnect structure using a patternable dielectric as an on-chip electrical insulator on a semiconductor chip.

FIG. 3A shows an initial structure 10 that can be used in this embodiment of the present invention. The initial structure 10 shown in FIG. 3A is identical to the initial structure shown in FIG. 1A. Specifically, the initial structure shown in FIG. 3A also includes a substrate 12, an optional dielectric cap 14 located on a surface of the substrate 12, and an ARC 16 located on the surface of the dielectric cap 14. The materials, deposition methods, and thickness of each of substrate 12, optional dielectric cap 14 and ARC 16 are the same as that described above for the dual-damascene embodiment of the present invention.

Figure 3B:
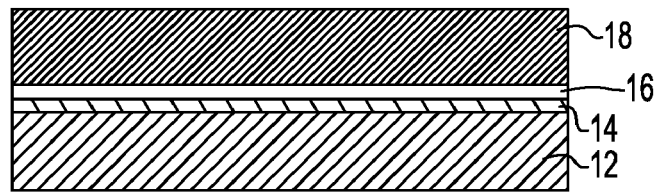

FIG. 3B shows the structure of FIG. 3A after forming a patternable low-k material 18 directly on the surface of the ARC 16. The patternable low-k material 18 may be a positive-tone material or a negative-tone material. The composition of the patternable low-k material 18 in this embodiment of the invention is the same as that mentioned above in the dual-damascene embodiment. Also, the patternable low-k material 18 is formed as described above and it has a thickness within the ranges mentioned above as well.

Figure 3C:
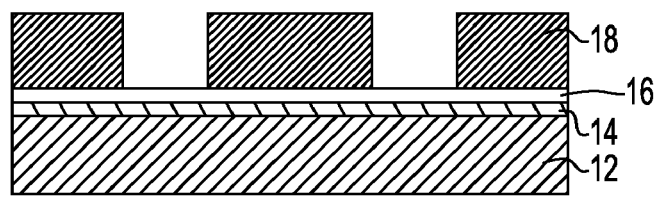

FIG. 3C illustrates the structure after forming interconnect patterns 20 within the patternable low-k film 18. The interconnect patterns 20 may include at least one via opening (as shown and as preferred) or at least one line opening. As shown, the first interconnect pattern exposes a surface of the ARC 16, if present. The formation of the interconnect patterns 20 into the patternable low-k material 18 includes the patterning process mentioned above in the dual-damascene embodiment.

Figure 3D:
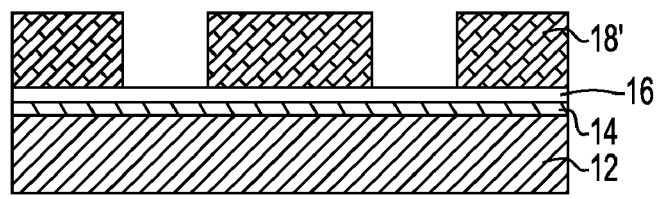

FIG. 3D illustrates the structure that is formed after curing the patternable low-k material 18 into cured low-k material 18'. The cured low-k material 18' has a dielectric constant within the ranges mentioned above and it also typically has Si atoms are bonded to cyclic rings (aliphatic or aromatic) via oxygen atoms. In the uncured state, such bonding is not observed. The cure methods, equipment and processes mentioned above for the patternable low-k material 18 in the dual damascene embodiment are each applicable here for the patternable low-k material 18 in this singe damascene embodiment.

If the as-deposited inorganic antireflective coating 16 has been cured, the cure of the patternable low-k material also converts the inorganic antireflective coating 16 into a dielectric material with a dielectric constant less than 7.0.

Figure 4:
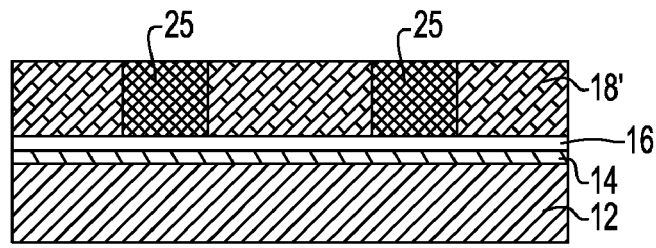
FIG. 4 shows the interconnect structure that is formed after further processing of the structure shown in FIG. 3D.

FIG. 4 illustrates the structure that is formed after further interconnect process steps including at least filling the interconnect patterns with a conductive material 25 and planarizing the same. The further processing steps of the present invention have been described in greater detail in regard to the dual-damascene embodiment. It should be noted that although FIG. 4 does not show the interconnect openings to extending through the ARC layer 16 and the cap layer 14, depending on the underlying substrate and connections required thereto, such openings can be provided using the means described in the dual-damascene embodiment.

The following examples are provided to illustrate some embodiments of the present invention.

Example 1

Single-Damascene Integration of Negative-Tone Patternable Low-k Dielectric (k=2.7) On-Chip Electrical Insulator

Example 1A

Inorganic Spin-On Antireflective Layer for Patternable Low-k Resist-1 (PPLKARC01)

An inorganic spin-on antireflective coating composition was formulated with the following components: 1.5 g of 9-anthracenemethanol bounded poly(4-hydroxybenzylsilsesquioxane) with 20% of 9-anthracenemethanol, 0.176 g of glycoluril resin (POWDERLINK cross-linking agent), 0.088 g of K-Pure 2678 (thermal acid generator from King Industry), 0.1 g of FC430 surfactant (10 wt % PGMEA solution sold by 3M Corporation) and 33.429 g of propylene glycol monomethyl ether acetate (PGMEA) to form a solution with a 5 wt. % of total solid content. The resulting formulation was filtered through a 0.2 micron filter.

Example 1B

Inorganic spin-On Antireflective Layer for Patternable Low-k Resist-2 (PPLKARC02)

An inorganic spin-on antireflective coating composition was formulated with the following components: 1.5 g of 9-anthracenemethanol bounded poly(4-hydroxybenzylsilsesquioxane) with 15% of 9-anthracenemethanol, 0.176 g of glycoluril resin (POWDERLINK cross-linking agent), 0.088 g of K-Pure 2678 (thermal acid generator from King Industry), 0.1 g of FC430 surfactant (10 wt % PGMEA solution sold by 3M Corporation) and 33.429 g of propylene glycol monomethyl ether acetate (PGMEA) to form a solution with a 5 wt. % of total solid content. The resulting formulation was filtered through a 0.2 micron filter.

1. Inorganic Spin-On ARC Process

The inorganic spin-on antireflective coating composition in Example 1A (PPLKARC01) was deposited on a 200 mm silicon wafer having a 350 Å NBLOK top layer on a TEL MARK 8 track at 2000 rpm for 30 see and post apply based at 150° C. for 120 sec.

2. Patternable Low-k Material

A patternable low-k composition was formulated with 60 g of a 20 wt % solution of 6:4 pHMBS/MBS in propylene glycol monomethyl ether acetate (PGMEA), 40 g of a 20 wt % solution of the silsesquioxane copolymer LKD-2021, 2 g of a 20 wt % solution of triphenylsulfonium nonaflate in PGMEA, and 2 g of a 0.5 wt % solution of an organic base such as trioctylamine in PGMEA. The resulting patternable low-k formulation was filtered through a 0.2 micron filter.

3. Litho Process

A patternable low-k composition formulated above was spin coated (2000 rpm for 30 seconds) on top of the inorganic spin-on ARC layer on a 200 mm silicon wafer to produce an approximately 0.6 μm film. The wafer and film were pre-exposure baked at about 110° C. for 60 seconds (s), pattern-wise exposed to 248 nm deep ultraviolet (DUV) light on an ASML (0.63 NA, 3/6 annular) DUV stepper with a chrome on glass mask, and then post exposure baked at 110° C. for 60 sec. This was followed by two 30 second puddle development steps with 0.26 N TMAH developer to resolve 250 nm line and space features at a radiant energy dose of 24 mJ/cm$^2$.

4. UV Cure Process

The wafer with 250 nm line and space pattern was subjected to a UV-thermal cure in a 200 mm Applied Materials Producer broadband UV cure tool. The process conditions were 400° C. for 10 min under a N$_2$ atmosphere and a pressure of 8 Torr. This UV thermal cure converted the patternable low-k resist and the inorganic ARC layer into a low-k dielectric materials. It also maintained the patternable low-k resist features obtained during the lithographic process. It further improved the sidewall angle of the patternable low-k resist features. The dielectric constant of this patternable low-k composition cured under this condition is 2.7.

5. Analysis a. X-section SEM

The post UV cure SEM of the patternable low-k dielectric structure was taken on a LEO low voltage SEM.

b. Cu/Low-K X-Section

The patternable low-k/Cu interconnect structure was cross-sectioned and examined in a Hitachi SEM. The cross-sectioned surface was polished, decorated with a diluted HF aqueous solution.

Example 2

Single-Damascene Integration of Negative-Tone Patternable Low-k Dielectric (k=2.7) On-Chip Electrical Insulator 1. Material Composition A patternable low-k composition was formulated with 60 g of a 20 wt % solution of 6:4 pHMBS/MBS in propylene glycol monomethyl ether acetate (PGMEA), 40 g of a 20 wt % solution of the silsesquioxane copolymer LKD-2021, 2 g of a 20 wt % solution of triphenylsulfonium nonaflate in PGMEA, and 2 g of a 0.5 wt % solution of an organic base such as trioctylamine in PGMEA. The resulting patternable low-k formulation was filtered through a 0.2 micron filter.

The inorganic spin-on antireflective coating composition in Example 1A (PPLKARC01) was deposited on a 200 mm silicon wafer having a 350 Å NBLOK top layer on a TEL MARK 8 track at 2000 rpm for 30 sec and post apply based at 150° C. for 120 sec.

2. Litho Process

The patternable low-k composition formulated above was spin coated (2000 rpm for 30 seconds) on top of the inorganic spin-on ARC layer on a 200 mm silicon wafer to produce an approximately 0.6 μm film. The wafer and film were pre-exposure baked at about 110° C. for 60 seconds, pattern-wise exposed to 248 nm deep ultraviolet (DUV) light on an ASML (0.63 NA, 3/6 annular) DUV stepper with a chrome on glass mask, and then post exposure baked at 110° C. for 60 seconds. This was followed by two 30 second puddle development steps with 0.26 N TMAH developer to resolve 250 nm line and space features at a radiant energy dose of 24 mJ/cm$^2$.

3. UV Cure Process

The wafer with 250 nm line and space pattern was subjected to a UV-thermal cure in a 200 mm Applied Materials Producer broadband UV cure tool. The process conditions were 400° C. for 10 min under a N$_2$ atmosphere and a pressure of 8 Torr.

4. Liner Process

Liner and Cu seed were deposited in a 200 mm Endura Encore Ta/TaN tool from Applied Materials. About 95 Å TaN, 190 Å Ta, and 600 Å Cu seed were deposited sequentially.

5. Cu plating and Annealing

This wafer was electrochemically plated on SEMITOOL tool to fill the trenches with about 750 nm Cu. The as-plated wafer was annealed at 350° C. for 1 hr in a $N_2$ atmosphere in a copper anneal oven.

6. Cu CMP Process

The excessive Cu was removed by chemical-mechanical polishing with an Ebara Frex Polisher. The polishing was conducted in stages with a V3 high-abrasive slurry. The total polish time was For Cu CMP, V3:High Abrasive; Totalo polish time 45 sec.

7. NBLoK Cap

A 350 Å of NBLOK cap layer was deported on top of the polished patternable low-K/Cu interconnect with a 200 mm CVD tool (Centura) from Applied Materials Inc.

8. Analysis a. X-Section SEM
  The post UV cure SEM of the patternable low-k dielectric structure was taken on a LEO low voltage SEM.
  b. Cu/Low-K X-Section
  The patternable low-k/Cu interconnect structure was cross-sectioned and examined in a Hitachi SEM. The cross-sectioned surface was polished, decorated with a diluted HF aqueous solution.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating an interconnect structure comprising:
   providing at least one patternable low-k material on a surface of an inorganic antireflective coating (ARC) that is located atop a substrate, said inorganic antireflective coating is liquid deposited and comprises a polymer that has at least one monomer unit comprising the formula $M-R^1$ wherein M is at least one of Si, Ge, B, Sn, Fe, Ta, Ti, Ni, Hf and La and $R^1$ is a chromophore;
   forming at least one interconnect pattern within said at least one patternable low-k material, said at least one interconnect pattern is formed without utilizing a separate photoresist material; and
   curing said at least one patternable low-k material and the inorganic ARC into materials having a dielectric constant of not more than 4.3 and 7.0, respectively.

2. The method of claim 1 wherein said inorganic antireflective coating further includes at least one second monomer unit, said at least one second monomer unit has the formula $M'-R^2$, wherein M' is at least one of Si, Ge, B, Sn, Fe, Ta, Ti, Ni, Hf and La and $R^2$ is a cross-linking agent.

3. The method of claim 1 further comprising at least one additional component, including a separate crosslinker, an acid generator or a solvent.

4. The method of claim 1 wherein said at least one patternable low-k material comprises a functionalized polymer having one or more irradiation/acid-sensitive imageable groups.

5. The method of claim 4 wherein said functionalized polymer comprises a polymer of a hydrocarbon, a fluorinated hydrocarbon, a siloxane, a silane, a carbosilane, an oxycarbosilane, an organosilicate or a silsesquioxane.

6. The method of claim 1 wherein said curing comprises a thermal cure, an electron beam cure, an UV cure, an ion beam cure, a plasma cure, a microwave cure or any combination thereof.

7. The method of claim 1 further comprising forming a conductive material within said at least one interconnect pattern.

8. A method of fabricating a dual-damascene interconnect structure comprising:
   providing a first patternable low-k material on a surface of an inorganic antireflective coating (ARC) that is located atop a substrate, said inorganic antireflective coating is liquid deposited and comprises a polymer that has at least one monomer unit comprising the formula $M-R^1$ wherein M is at least one of Si, Ge, B, Sn, Fe, Ta, Ti, Ni, Hf and La and $R^1$ is a chromophore;
   forming first interconnect patterns within the patternable low-k material without a separate photoresist material;
   providing a second patternable low-k material on top of the first patternable low-k material including said first interconnect patterns;
   forming second interconnect patterns within said second patternable low-k material without a separate photoresist material; and
   curing at least said second patternable low-k material and the inorganic ARC into materials having a dielectric constant of not more than 4.3 and 7.0, respectively.

9. The method of claim 8 wherein said inorganic antireflective coating further includes at least one second monomer unit, said at least one second monomer unit has the formula $M'-R^2$, wherein M' is at least one of Si, Ge, B, Sn, Fe, Ta, Ti, Ni, Hf and La and $R^2$ is a cross-linking agent.

10. The method of claim 8 further comprising at least one additional component, including a separate crosslinker, an acid generator or a solvent.

11. The method of claim 8 wherein said first and second patternable low-k materials are the same or different and comprise functionalized polymers having one or more irradiation/acid-sensitive imageable groups.

12. The method of claim 11 wherein said functionalized polymers comprise polymers of hydrocarbons, fluorinated hydrocarbons, siloxanes, silanes, carbosilanes, oxycarbosilanes, organosilicates or silsesquioxanes.

13. The method of claim 8 wherein said curing at least said second patternable low-k material comprises a thermal cure, an electron beam cure, an UV cure, an ion beam cure, a plasma cure a microwave cure or any combination thereof.

* * * * *